(12) United States Patent
Morisson

(10) Patent No.: US 7,635,996 B2
(45) Date of Patent: Dec. 22, 2009

(54) DIFFERENTIAL BLOCKING SAMPLER, IN PARTICULAR FOR AN ANALOG DIGITAL CONVERTER

(75) Inventor: Richard Morisson, Meylan (FR)

(73) Assignee: Atmel Grenoble S.A., Saint Egreve (FR)

( * ) Notice: Subject to any disclaimer, the term of this patent is extended or adjusted under 35 U.S.C. 154(b) by 37 days.

(21) Appl. No.: 10/570,322

(22) PCT Filed: Oct. 15, 2004

(86) PCT No.: PCT/EP2004/052551

§ 371 (c)(1),
(2), (4) Date: Mar. 2, 2006

(87) PCT Pub. No.: WO2005/038816

PCT Pub. Date: Apr. 28, 2005

(65) Prior Publication Data

US 2006/0220693 A1      Oct. 5, 2006

(30) Foreign Application Priority Data

Oct. 17, 2003   (FR)   ................................. 03 12187

(51) Int. Cl.
  *G11C 27/02*     (2006.01)
  *H03K 17/26*     (2006.01)

(52) U.S. Cl. .............................. 327/91; 327/94; 341/122

(58) Field of Classification Search ............. 327/91–95, 327/72; 341/122–125

See application file for complete search history.

(56) References Cited

U.S. PATENT DOCUMENTS 6,031,398 A   2/2000   Karanicolas

FOREIGN PATENT DOCUMENTS

| EP | 0532108 A | 3/1993 |
|----|-----------|--------|
| EP | 1074996 A | 2/2001 |

OTHER PUBLICATIONS

Razzaghi et al.. "A 10-b, 1-GSample/s track-and-hold amplifier using SiGe BiCMOS technology". Sep. 21-24, 2003. IEEE Custom Integrated Circuits Conference. pp. 433-436.*

(Continued)

*Primary Examiner*—Quan Tra
*Assistant Examiner*—Colleen O'Toole
(74) *Attorney, Agent, or Firm*—Lowe Hauptman Ham & Berner, LLP

(57) ABSTRACT

The invention relates to a blocking sampler intended in particular to be used upstream of a fast analog digital converter.

The blocking sampler comprises two main semi-samplers each having a respective differential input (E, E') and a respective differential output (S, S'). With each main semi-sampler is associated a respective auxiliary blocking semi-sampler comprising an auxiliary tracking transistor (T1a, T1a') powered by a voltage tapped off from the terminals of the storage capacitor (C', C) of the other main blocking sampler, an auxiliary storage capacitor (Ca, Ca') linked to the output of this auxiliary tracking transistor and an auxiliary current switch (T2a, T3a, SC1a; T2'a, T3'a, SC1a') controlled in synchronism with the current switch of the main blocking sampler so as to authorize or block the passage of current in the auxiliary tracking transistor. The auxiliary samplers serve to improve the sampling dynamics in the cases where the signal to be sampled varies rapidly.

9 Claims, 3 Drawing Sheets

OTHER PUBLICATIONS

Razzaghi A et al: "A 10-b, 1-GSample/s track-and-hold amplifier using SiGe BiCMOS technology" 2003, Piscataway, NJ, USA Sep. 2003 pp. 433-436.

Fiocchi C et al: "Design Issues on High-Speed High-Resolution Track-and-Holds in BiCMOS Technology"; IEEE-Proceedings: Circuit Devices and Systems, Institution of Electrical Engineers, Stenvenage, GB, vol. 147, No. 2, (Apr. 7, 2000), p. 100-106, XP006013845; ISSN: 1350-2409.

* cited by examiner

DIFFERENTIAL BLOCKING SAMPLER, IN PARTICULAR FOR AN ANALOG DIGITAL CONVERTER

The invention relates to blocking samplers, and in particular those which are intended to be placed upstream of an analog/digital converter.

A blocking sampler operates periodically, under the control of a clock, according to two alternate phases: the first phase is the sampling phase during which a voltage level of an input signal (in particular an analog signal that one wishes to convert into digital) is stored in a storage capacitor; the second phase is the blocking phase, during which the sampled voltage, that is to say the voltage stored in the capacitor, is held at its value, doing so for the whole time necessary for the operations done downstream of the blocking sampler. Typically, in an application to an analog/digital converter, it is known that the operation of analog/digital conversion takes a certain time and the blocking phase holds the level of sampled voltage throughout the time necessary for the conversion, before passing to a next sampling phase and to a next conversion.

The analog signal that one wishes to sample with a view to converting it, exhibits faster or slower variations and among the qualities of a blocking sampler is its ability to rapidly track the variations of the input signal.

This presupposes that there are not too many time constants in the circuits for charging and discharging the storage capacitor, and this presupposes in particular that the current sources which serve to charge the capacitor or to discharge it are sufficiently powerful.

A conventional way of embodying a blocking sampler consists in using
- a tracking transistor receiving the input signal (possibly after a buffer amplifier of gain 1 that will not be taken into consideration to simplify the explanations),
- a storage capacitor connected to the output of the tracking transistor,
- and a current switch for authorizing the passage of current in the tracking transistor during the sampling phases and for disabling it during the blocking phases.

An improved way of embodying a blocking sampler consists in using a symmetric differential arrangement, which makes it possible to eliminate the influence of the common-mode errors. In this case, the blocking sampler comprises two blocking semi-samplers each receiving a respective differential input and having a respective differential output, each semi-sampler comprising a tracking transistor, a storage capacitor, and a current switch.

The following observation is made here regarding the ability of the sampler to track fast variations of the input signal and to correctly sample the input signal despite these fast variations: firstly it is pointed out that the voltage sampled on the storage capacitor is not usually equal to the input voltage, but it is rather equal to the input voltage less a base-emitter voltage of the tracking transistor; if this base-emitter voltage were perfectly known, fixed, and identical for the two tracking transistors of the two semi-samplers, there would be no difficulty in the sampler operating perfectly since this voltage would be eliminated by subtraction in the differential output signal; however, in reality this base-emitter voltage may vary appreciably during charging and discharging of the storage capacitors, due to a fast variation of the input signal to be sampled; the base-emitter voltages of the two tracking transistors of the differential sampler tend to vary in opposite directions so long as the voltage across the terminals of the storage capacitor has not taken a stable final value; moreover the amplitude of the variation is not symmetric for the two transistors as will be explained in greater detail in what follows (in particular on account of the nonlinear form of the current-voltage characteristics of the transistors). Consequently, if the sampling is done at a high frequency and if the input signal exhibits fast variations, there is a risk that the storage capacitors will not have time to stabilize at their final value, and that current inrushes will persist in the tracking transistors at the end of the sampling period, inducing an error (not correctable by subtraction) in the voltages sampled in the storage capacitors. This third-order harmonic distortion error is of the form $H3=(CA\omega/I1)^2/12$ where C is the storage capacitance, I1 the current which flows through the tracking transistor, A the amplitude of the input signal, and $\omega$ the angular frequency of the signal.

The present invention is aimed at remedying this drawback. For this purpose it proposes a differential blocking sampler comprising two main semi-samplers each having a respective differential input and a respective differential output, each semi-sampler comprising at least a storage capacitor and a voltage tracking transistor operating as a tracker during sampling periods and blocked during blocking periods, characterized in that with each main semi-sampler (hereinafter called the main semi-sampler) is associated a respective auxiliary blocking semi-sampler comprising an auxiliary tracking transistor powered by a voltage tapped off from the terminals of the storage capacitor of the other main blocking sampler, an auxiliary storage capacitor linked to the output of this auxiliary tracker, an auxiliary current switch for authorizing or blocking the passage of current in the auxiliary tracking transistor, and a means for applying to the input of the auxiliary tracking transistor a voltage which tracks the variations of the input voltage of the main blocking sampler.

In a first embodiment, each main blocking semi-sampler comprises a main current switch actuated in synchronism with the associated auxiliary current switch, so as to authorize the conduction of the main tracking transistor of this main semi-sampler during the sampling periods and to disable this conduction during the blocking periods.

In a second embodiment, there is no main current switch, and it is the auxiliary current switch of the auxiliary semi-sampler associated with the main semi-sampler which undertakes this function of control of the tracking transistor of the main semi-sampler as of the auxiliary semi-sampler.

The voltage applied to the input of the auxiliary tracking transistor is preferably shifted by a value fixed by one or more tracking transistors for reasons of maintaining a sufficient bias of the auxiliary tracking transistor (which is powered by the voltage present on a storage capacitor).

The current of the auxiliary current sources is preferably equal to that of the main current sources and the value of the auxiliary capacitor is then preferably equal to half that of the main capacitors so as to optimise the third-order harmonic distortion H3 which is then divided by 4 (gain of 12 dB).

The current of the auxiliary current source may be equal to k times the current of the main source, k being preferably greater than 1.

Other characteristics and advantages of the invention will become apparent on reading the detailed description which follows and which is given with reference to the appended drawings in which.

The invention will be described with reference to a technology using bipolar transistors which are in general more advantageous from the point of view of speed.

However, the invention is also applicable to technologies using only MOS transistors. In this case, it will be understood that the concepts of transistor emitter, base and collector must be replaced by the concepts of gate, source and drain, without this changing the principles of the invention. The vocabulary emitter, base, collector will therefore be used in a very general sense in this description and in the claims.

Figure 1:
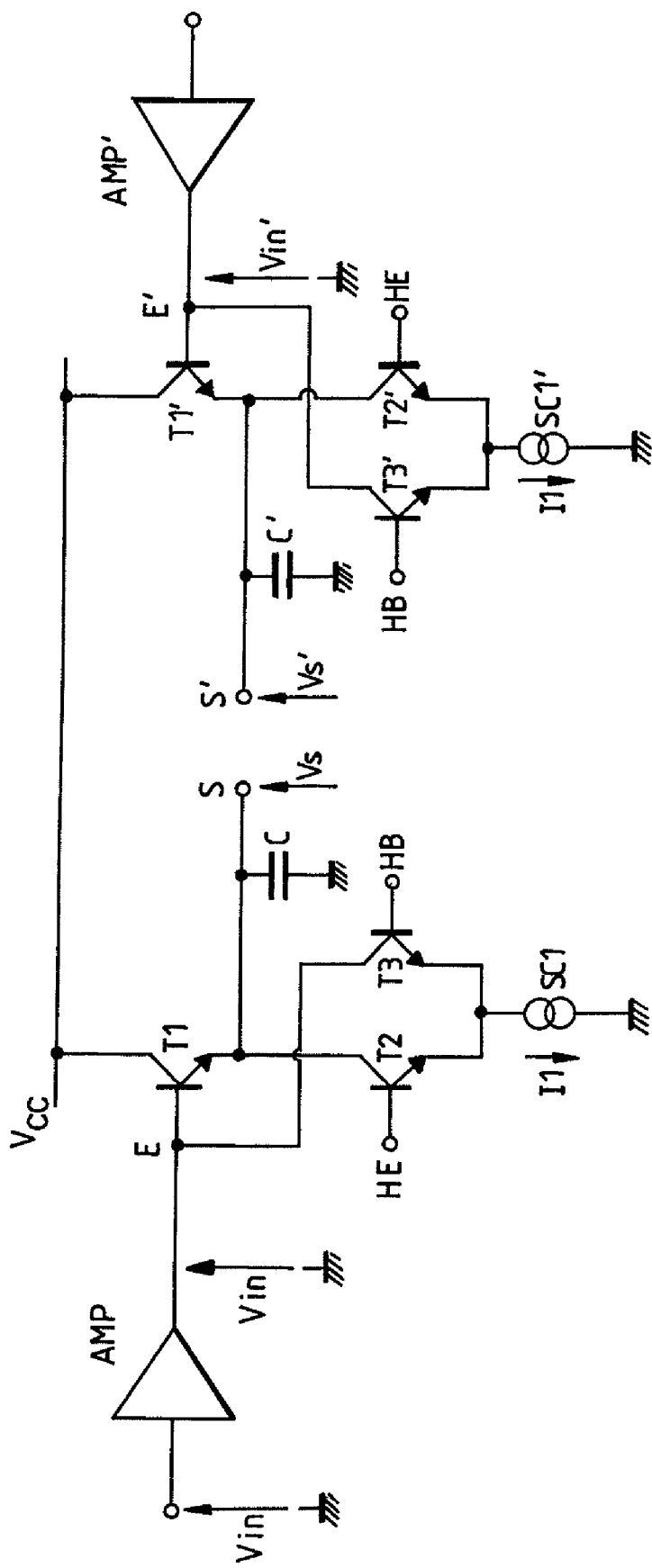
FIG. 1 represents a simplified diagram of a differential blocking sampler of the prior art.

FIG. 1 represents the general principle of a differential blocking sampler intended to sample a differential input voltage Vin–Vin' applied in the form of a voltage Vin to a first input and a voltage Vin' to a second input of the sampler. These voltages to be sampled are in general applied to buffer amplifiers of unit gain AMP and AMP' respectively, which have a high input impedance and a low output impedance so that the blocking sampler is not a source of disturbances in respect of the signal which is applied to it. It will therefore be considered, disregarding these buffer amplifiers of unit gain, that the blocking sampler proper has two inputs E and E' which are the outputs of the amplifiers AMP and AMP' and which receive voltages which are replicas of the voltages Vin and Vin'.

The blocking sampler provides on two differential outputs S and S' voltages which are periodic samples Vs and Vs' representing the input voltages Vin and Vin'; between S and S' appear differential samples Vs–Vs' of the differential input voltage Vin–Vin'.

The blocking sampler proper comprises two identical circuits which are two blocking semi-samplers having as inputs respectively the input E for the left semi-sampler and the input E' for the right semi-sampler, and as output respectively the output S and the output S'. The differential output voltage of the blocking sampler is taken between the outputs S and S' of the two semi-samplers.

The left blocking semi-sampler (input E, output S) essentially comprises,

- a voltage tracking transistor, T1, having its base (which will also be called its "input") connected to the input E, its emitter (which will also be called its "output") linked to the output S, and its collector linked to a supply voltage Vcc (regarding this latter point, variants are possible with a transistor for holding a blocking level on the base of the tracking transistor),
- a storage capacitor C linked between the output S (hence the emitter of T1) and a common earth of the circuit;
- a means of switching for authorizing the operation of the transistor T1 in voltage tracking mode during the sampling phases so that the voltage across the terminals of the capacitor C tracks the variations of the voltage on the input E, and to disable the discharging of the capacitor C during the blocking phases so that the voltage sampled on the output S remains constant throughout the blocking phase which follows each sampling phase.

The switching means is conventionally constituted by a group of two transistors T2 and T3 operating in all or nothing mode and in mutual phase opposition under the control of a periodic clock providing sampling HE and blocking HB signals. The sampling signal HE is at a high logic level when the blocking signal HB is at a low logic level and vice versa.

The transistor T2 has its collector linked to the emitter of the transistor T1 and its emitter linked to a current source SC1 traversed by a constant current of value I1. The base of T2 is controlled by the sampling signal HE. During the sampling phase (HE at the high level), the transistor T2 is rendered conducting and the emitter of T1 is traversed by a constant current I1. The transistor T1 operates as a voltage tracker and the voltage Vs applied by its emitter to the storage capacitor C is the input voltage Vin less an emitter-base voltage Vbe1 of the transistor T1 (Vbe1 is equal to around 0.7 to 0.8 volts for a bipolar transistor and is dependent on I1 but I1 is a fixed value). Vs=Vin–Vbe1. While the sampling signal is in the high state, the transistor T3, arranged as will be explained later, is blocked and has no influence on the manner of operation just indicated.

The duration of the high logic state of the sampling signal HE is sufficient for the capacitor C to have time to charge up to the value Vs=Vin–Vbe1, and this duration therefore depends on the parameters which influence the charging time constant of the capacitor (size of the transistor T1 in particular, value of the current I1, value of the capacitor, value of the stray resistances of the connections, etc.).

The transistor T3 has its collector linked to the base of the transistor T1, its emitter linked to the current source SC1, and its base controlled by the blocking signal HB complementary to the sampling signal HE.

When the blocking signal HB is at the high level, not only is the transistor T2 blocked and does it tend to prevent the transistor T1 from operating as a tracker, but the transistor T3 is rendered conducting and tends to draw a current from the input E, thereby lowering the base potential of the transistor T1 and blocking the latter. The transistors T1 and T2 being palpably blocked, there is no longer any current path which would tend to discharge the voltage Vs which was previously stored on the capacitor C.

The left semi-sampler in FIG. 1 (transistors T1, T2, T3, current source SC1 and storage capacitor C) therefore applies a voltage Vs=Vin–Vbe1 to the capacitor C during the sampling phase and holds this voltage during the blocking phase. The right semi-sampler is strictly identical and the corresponding elements are designated by the same letters and digits, with the "prime" symbol: transistors T1', T2', T3', capacitor C', current source SC1' (with the same current I1 as the source SC1); the sampling and blocking controls HE and HB simultaneously control the two blocking semi-samplers. The output S' is brought to a voltage Vs'=Vin'–Vbe1'.

The differential output voltage Vs–Vs' is equal to Vin–Vin', the base-emitter voltages Vbe1 and Vbe1' of the transistors T1 and T1' cancel each other out since they are identical on account of the fact that the transistors are identical and traversed by the same current I1.

However, when seeking to increase the performance of the blocking sampler, and in particular when seeking to increase its speed of operation and the rate of variation of the signals that one wishes to sample, the following limit is encountered: the voltage across the terminals of the capacitor C does not always have time to take the value Vin before the end of the sampling phase (end of HE) when the input signal varies fairly swiftly, that is to say when the voltage Vin(T) to be sampled at a given instant T is very different from the voltage Vin(T−1) sampled at the previous sampling instant T−1 and also when the voltage Vin(t) varies fairly strongly as a function of time T during the sampling phase itself.

Let us assume that, during differential operation, the differential input signal varies strongly, Vin increasing and Vin' decreasing accordingly.

The voltage Vin(T) is greater than the voltage Vin(T−1) of the previous sampling instant; the transistor T1 sees Vin(T) on its base and Vin(T−1)−Vbe1 on its emitter; its base-emitter voltage is biased in such a way as to render it properly conducting and its emitter will be traversed not only by the current I1 of the source SC1 but also by a current sufficient to rapidly charge the capacitor C to the new sampled voltage Vin(T)−Vbe1; as soon as the capacitor C is charged to this voltage, it no longer needs any charging current and the transistor T1 remains traversed by the current I1 alone, its emitter-base voltage is then equal to the same value Vbe1 corresponding to this current I1; the charging of the capacitor C may be fast if the transistor T1 is capable of providing a fairly high current; the size of T1 is chosen accordingly; however, if during the sampling phase and up to the end of the latter the voltage Vin(t) continues to increase, the transistor T1 continues to provide a current for charging the capacitor; its current is greater than I1, its base-emitter voltage will be Vbe1+dVbe1, slightly greater than the normal voltage Vbe1; the sampled voltage is slightly different from that which is desired;

However, in the other semi-sampler, the situation may be more difficult.

The voltage Vin'(T) is less than the voltage Vin'(T−1) of the previous sampling instant; the transistor T1' sees Vin'(T) on its base and Vin'(T−1)−Vbe1 on it emitter; this overly small base-emitter voltage greatly reduces the conduction of the transistor T1'. The capacitor C' may discharge through the transistor T2' (conducting) into the constant current source SC1'; when the capacitor is discharged to a value close to the new desired value Vin'(T)−Vbe1' the transistor T1' progressively becomes conducting again; at the end of the sampling period, the voltage across the terminals of the capacitor stabilizes at Vin(T)−Vbe1' where Vbe1' is the normal base-emitter voltage of the transistor T1' traversed by I1. In the general case, there is no problem, but it is seen that the capacitor C' must discharge all the more as the new voltage Vin(T) is more different from the voltage Vin(T−1); however it can discharge only with the current I1 of the source SC1' whatever the size of the transistor T1. The discharge rate dV/dt is therefore limited to I1/C'. This rate is not necessarily sufficient. And the capacitor C' may finish up at the end of the sampling phase with a voltage which has not had time to descend to its value Vin(T)−Vbe1'.

It will therefore be noted that when the input voltage descends, the discharge rate is limited by the value of I1. When it rises, the charging rate is limited only by the capacity of the transistor T1 (or T1') to conduct a large current. The situation is therefore asymmetric.

Moreover, it should be noted that if the capacitor C' has not had time to discharge sufficiently, this will also imply that the transistor T1' is still blocked or only slightly conducting (in all cases it does not conduct the current I1 that it ought to conduct); consequently its voltage Vbe1' is not at all equal to its nominal value. As a result, when by subtraction a differential voltage Vs−Vs' is obtained between the two storage capacitors, the two base emitter voltages Vbe1 and Vbe1' do not eliminate one another in the subtraction, one being equal to the normal voltage corresponding to the passage of an emitter current I1 or perhaps slightly greater, and the other being palpably lower.

Finally, even if the offset between Vin'(T) and Vin'(T−1) is not considerable, it may happen that the voltage Vin'(t) varies fairly rapidly in a direction that decreases towards the end of the sampling phase, and the same phenomenon occurs: even if the capacitor C' manages to discharge at a sufficient rate to track the variation of Vin', this discharge is possible only by virtue of the fact that the transistor T1' conducts a small current, weaker than I1, and the base-emitter voltage Vbe1' of the transistor T1' is in this case noticeably smaller than the nominal voltage corresponding to the passage of a current I1 in the transistor. Here again, when the voltage Vs−Vs' is taken between the capacitors, the base-emitter voltages Vbe1 and Vbe1' of the transistors T1 and T1' are not identical and do not eliminate one another, inducing a sampling error. The sampled differential voltage no longer represents Vin−Vin'.

The aim of the invention is to attempt to correct this sampling error while minimizing the base-emitter voltage errors of T1 and T'1. It will be understood that it would be possible to increase the current I1 to partly reduce the risk of error since the capacitor may then discharge rapidly when the input signal varies rapidly. However, an increase in I1 is prejudicial since it increases the overall consumption of the circuit and the size of the transistors of the circuit.

Figure 2:
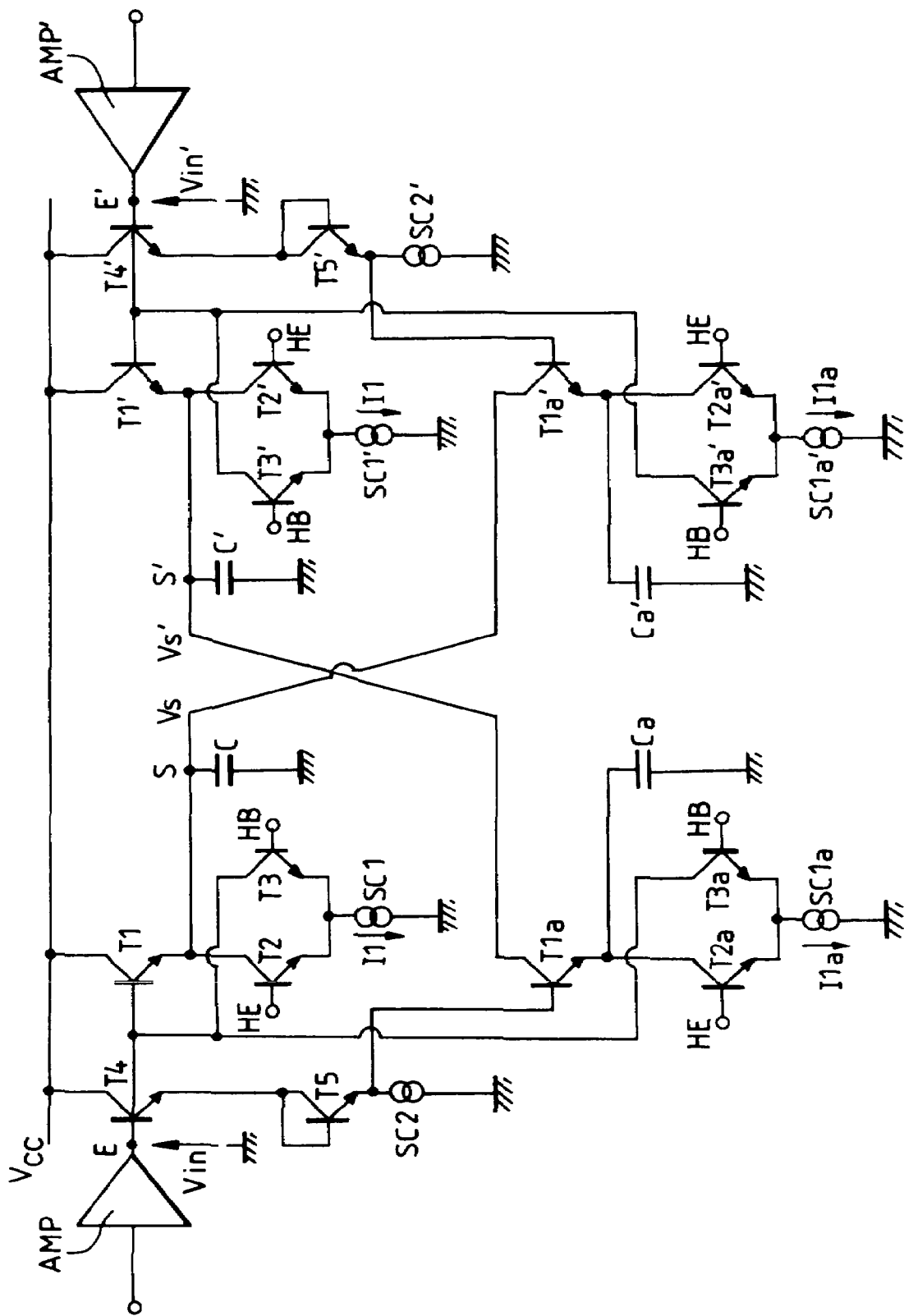
FIG. 2 represents a simplified diagram of a blocking sampler according to the invention.

The diagram of FIG. 2 schematizes the principle of the invention. With each semi-sampler which will now be called main semi-sampler is associated an auxiliary semi-sampler which operates in synchronism with the main semi-samplers (same clock signals HE and HB). The auxiliary blocking semi-sampler associated with a main semi-sampler draws its supply current from the output S or S' of the other main semi-sampler and not from the supply terminal Vcc.

The auxiliary semi-sampler associated with the left main semi-sampler (T1, T2, T3, SC1, C) takes its current supply on the output S' of the right main semi-sampler (T1', T2', T3', C';, SC1').

This auxiliary semi-sampler is constituted like the main semi-sampler with which it is associated; it comprises an auxiliary tracking transistor T1a, an auxiliary storage capacitor Ca, an auxiliary switch consisting of two transistors T2a and T3a, and an auxiliary current source SC1a. The input voltage which is applied to this auxiliary semi-sampler is the voltage Vin but less a fixed voltage for reasons of biasing of the auxiliary tracking transistor T1a, since the latter is not powered by the voltage Vcc but by a variable, smaller voltage tapped off from the output S'. In the example represented in FIG. 2, the fixed voltage shift between the voltage Vin applied to the input E and the voltage applied to the base of the tracking transistor T1a is equal to around 1.5 volts and is defined by the sum of two base-emitter voltages Vbe4 and Vbe5 of transistors T4 and T5 traversed by the fixed current of a current source SC2. The transistor T4 is a tracking transistor having its base linked to the input E and receiving Vin on this base; its collector is linked to the power supply Vcc, and its emitter is linked in series with the transistor T5, which is arranged as a diode (collector and base joined and linked to the emitter of T4). The series assembly of the transistors T4 and T5 is linked to the current source SC2. The voltage on the emitter of T5 is equal to Vin−Vbe4−Vbe5 and is applied to the base of the auxiliary tracking transistor T1a; Vbe4 and Vbe5 are fixed and the base of the transistor T1a therefore fully tracks the temporal variations of Vin.

The auxiliary storage capacitor Ca is linked on one side to the emitter of the auxiliary tracking transistor T1a, on the other side to earth.

The collector of T1a is linked to the output S' and therefore to the storage capacitor C'. The current consumed by the transistor T1a is therefore tapped off from this output S' and comes from the emitter of the transistor T'1 or possibly from the capacitor C' when the latter discharges.

For the remainder, the auxiliary blocking semi-sampler comprises the switch constituted by the transistors T2a and T3a, one having its base controlled by the sampling signal HE and the other having its base controlled by the blocking signal HB. The emitters of these two transistors are linked to a constant current source SC1a (current I1a); the collector of T2a is linked to the emitter of the tracking transistor T1a so as to authorize the passage of current in the emitter of T1a to the source SC1a during the sampling phase and to disable it during the blocking phase. The collector of the transistor T3a is linked to the input E to lower the potential of this input during the blocking phases and thus to block the conduction of the transistors T4, T5 and T1a and to isolate the capacitor Ca during the blocking phases.

The auxiliary semi-sampler associated with the right main semi-sampler is strictly symmetric and comprises the tracking transistor T1a', the capacitor Ca', the switch T2a', T3a', SC1a'. The transistors and current sources of the right blocking semi-samplers are strictly identical to those of the left semi-samplers.

The circuit operates in the following way: firstly, it is assumed that the input voltage Vin–Vin' can hardly vary, that is to say that the potentials Vin and Vin' do not change rapidly during the sampling phase or between two sampling phases. We shall see later what happens when these potentials change rapidly.

The base-emitter voltages of the transistors T1, T4, T5, T1a, T1' will be designated by Vbe1, Vbe4, Vbe5, Vbe1a, Vbe1', etc. respectively.

When the potentials Vin and Vin' change slowly, the capacitors C and Ca charge up respectively to the potential Vin–Vbe1 and Vin–Vbe4–Vbe5–Vbe1a; the capacitors C' and C'a charge up respectively to the potential Vin'–Vbe'1 and Vin'–Vbe4'–Vbe5'–Vbe1a'. All the base-emitter voltages are normal voltages of conducting transistors traversed by the currents present in the static regime in the transistors. As far as the transistors T4, T5, T4', T5' are concerned, the nominal currents are those of the sources SC2, SC2'; as far as T1a and T1a' are concerned this is the current I1a of the sources SC1a, SC1a'; however be careful, as regards the transistors T1 and T1', the nominal current is the sum I1a+I1 since when the voltage in the capacitors C, C', Ca, Ca' is stabilized, the transistor T1 conducts a DC current I1 to the transistor T2 and the source SC1 and a DC current I1a to the right blocking semi-sampler connected to the output S, and more precisely to the transistor T1a', the transistor T2a and the source SC1a.

The differential voltage between the outputs S and S' after subtraction of the identical base-emitter voltages of the two halves of the circuit is indeed Vin–Vin'. Likewise for the differential voltage between the capacitors Ca and Ca'.

In the presence of a differential voltage that has varied strongly between two sampling instants T–1 and T, it is assumed for example that Vin has increased strongly and Vin' has decreased strongly. We shall see later what happens if the voltages continue to increase and decrease during the sampling phase itself.

The voltage Vin(T)–[(Vin(T–1)–Vbe1] applied between base and emitter of T1 is greater than a normal Vbe1 and renders T1 strongly conducting and able to charge the capacitor C until it takes a voltage Vin(T)–Vbe1 where Vbe1 is in principle the nominal value for a current I1+I1a in the transistor T1. However, moreover, as the voltage initially charged in the auxiliary capacitor Ca was [Vin(T–1)–Vbe4–Vbe5–Vbe1a] (all these Vbe being in principle nominal) the voltage applied between base and emitter of T1a becomes [Vin(T)–Vbe4–Vbe5]–[Vin(T–1)–Vbe4–Vbe5–Vbe1a]. This voltage is greater than the nominal voltage Vbe1a and renders T1a strongly conducting. T1a begins to conduct a current I1a+dI1a which is greater than I1a. This current I1a+dI1a is tapped off from the output S' of the right semi-sampler; the fraction dI1a will charge the capacitor until the voltage across the terminals of the capacitor Ca reaches a value [Vin(T)–Vbe4–Vbe5–Vbe1a]. Thus, the current in the transistor T1a stabilizes at the value I1a and there is no longer any charging current in the capacitor Ca until the end of the sampling phase. The current I1a, extracted continuously from the output S', originates from the emitter of the transistor T1'.

As at the same time the voltage Vin' applied to the right sampler has decreased strongly from Vin'(T–1) to Vin'(T), the capacitor C' discharges into the transistor T2' with a discharge current which may be as much as I1, but it also discharges to the auxiliary transistor T1a which invokes a current I1a+dI1a. The discharge rate of the capacitor C' may correspond to a sizeable discharge current I1+I1a+dI1a being limited only by the ability of the transistor T1a to conduct a high current.

If one wishes to keep the same overall consumption as in the blocking sampler of FIG. 1, it is in practice necessary for I1+I1a in FIG. 2 to be equal to the current of the source SC1 of FIG. 1, which implies, simply speaking, that it is for example possible to take I1a to have the same value as I1, this value being half the value of the source SC1 of FIG. 1. However, the presence of the term dI1a (which may represent a sizeable current) implies that the capacitor C' will discharge markedly more quickly in the case of FIG. 2 than in the case of FIG. 1.

Since C' discharges quickly, the potential difference between base and emitter of T1' can more rapidly revert to a nominal value Vbe1'; at the end, the capacitor C' ceases discharging; the voltage Vs' takes the desired value Vin'–Vbe1'; the current in T1' becomes the sum of the current I1 which flows in T'2 and of the current I1a which flows from the output S' to the transistor T1a.

In order for the rates of change of voltages across the terminals of Ca and C to be identical or nearly identical, it has been found that it was desirable for the capacitor Ca to have half the value of the capacitor C.

$$Ca=C/2$$

In the foregoing, it was assumed that Ia=I1; however, this is not compulsory and it is preferable that I1a=kI1, with k greater than 1.

Figure 3:
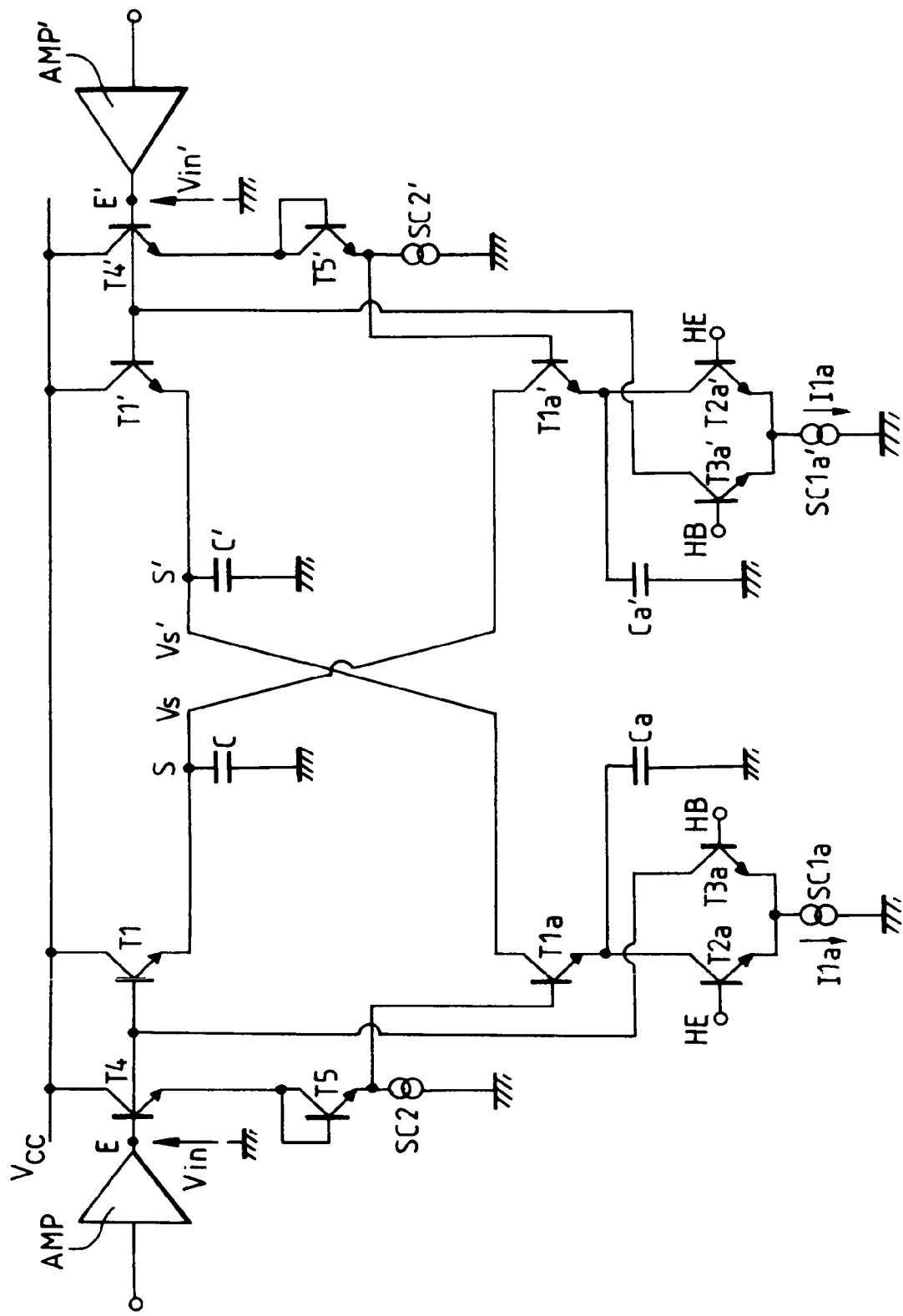
FIG. 3 represents a variant embodiment.

In a variant embodiment represented in FIG. 3, the possibility is even envisaged that the current I1 is zero and that only a current I1a is used (k being infinite as it were). The main switch of the main blocking semi-samplers is then purely and simply dispensed with, that is to say the transistors T2, T3, T'2, T'3 and the current sources SC1 and SC'1 are dispensed with. The transistors of the auxiliary current switches (transistors T2a, T3a, T'2a, T'3a and current sources SC1a and SC'1a) are connected in such a way that they in fact undertake not only the switching of current in the transistors T1a and T'1a but also the switching of current in the transistors T1 and T'1. They cause the transistors T1 and T'1 to operate as trackers during the sampling phases and block them during the blocking phases.

The preferred value of the auxiliary capacitor Ca or C'a is here again half that of the main capacitor C or C'.

The diagrams of FIGS. 2 and 3 are simplified diagrams and may be improved in various ways. In particular, provision will preferably be made for the following supplementary elements:

an output amplifier of unit gain, similar to the amplifier AMP, downstream of the output S, and another downstream of the output S';

a transistor for holding a blocking potential level of the transistor T1 during the blocking phase; this holding transistor ("clamp") has its collector linked to Vcc, its base linked to the output amplifier, and its emitter linked to the base of T1. It fixes the base potential of T1 at a level below the emitter potential during the blocking phase. The same thing is of course provided for in respect of the holding of the blocking of the transistor T1'.

The invention claimed is:

1. A differential blocking sampler comprising two main semi-samplers each having a respective differential input and a respective differential output, each semi-sampler comprising a storage capacitor and a voltage tracking transistor having an emitter driven by a constant current source during sampling periods and a base connected to the respective differential input, said voltage tracking transistor operating as a voltage tracker to continuously track the voltage on the respective differential input during sampling periods and being blocked during blocking periods, the emitter of said voltage tracking transistor being connected to the respective storage capacitor so that the voltage on the capacitor follows the voltage on said emitter during said sampling periods and is held during said blocking periods, wherein with each main semi-sampler is associated a respective auxiliary blocking semi-sampler comprising an auxiliary tracking transistor having a collector powered by a terminal of the storage capacitor of the other main semi-sampler and an emitter driven by a constant current source during said sampling periods, an auxiliary storage capacitor linked to the emitter of the auxiliary tracking transistor, an auxiliary current switch for authorizing, during said sampling periods, or blocking, during said blocking periods, the passage of current in the auxiliary tracking transistor, and a means for applying to a base of the auxiliary tracking transistor a voltage which tracks the voltage on the respective differential input of said each main semi-sampler.

2. The blocking sampler as claimed in claim 1, wherein each main semi-sampler comprises a main current switch actuated in synchronism with the auxiliary current switch associated with the main semi-sampler, so as to authorize the conduction of the main tracking transistor of this main semi-sampler during the sampling periods and to disable this conduction during the blocking periods.

3. The blocking sampler as claimed in claim 1, wherein the means for applying a voltage to the input of the auxiliary tracking transistor comprises at least one supplementary tracking transistor powered at constant current, receiving on its input the input voltage of the main blocking sampler and providing at its output a shifted voltage which tracks the variations in the input voltage of the main blocking sampler.

4. A differential blocking sampler comprising two main semi-samplers each having a respective differential input and a respective differential output, each semi-sampler comprising a storage capacitor and a voltage tracking transistor operating as a voltage tracker during sampling periods and blocked during blocking periods, wherein with each main semi-sampler is associated a respective auxiliary blocking semi-sampler comprising an auxiliary tracking transistor powered by a voltage tapped off from terminals of the storage capacitor of the other main blocking sampler, an auxiliary storage capacitor linked to the output of this auxiliary tracker, an auxiliary current switch for authorizing or blocking the passage of current in the auxiliary tracking transistor, and a means for applying to the input of the auxiliary tracking transistor comprises at least one supplementary tracking transistor powered at constant current, receiving on its input the input voltage of the main blocking sampler and providing at its output a shifted voltage which tracks the input voltage of the main blocking sampler, wherein the means for applying a voltage to the input of the auxiliary tracking transistor furthermore comprises a transistor arranged as a diode in series between the output of the supplementary tracking transistor and the input of the auxiliary tracking transistor.

5. The blocking sampler as claimed in claim 1, wherein the value of the auxiliary storage capacitor is equal to half the value of the storage capacitor of the main sampler.

6. The blocking sampler as claimed in claim 2, wherein the means for applying a voltage to the input of the auxiliary tracking transistor comprises at least one supplementary tracking transistor powered at constant current, receiving on its input the input voltage of the main blocking sampler and providing at its output a shifted voltage which tracks the variations in the input voltage of the main blocking sampler.

7. The blocking sampler as claimed in claim 2, wherein the value of the auxiliary storage capacitor is equal to half the value of the storage capacitor of the main sampler.

8. The blocking sampler as claimed in claim 3, wherein the value of the auxiliary storage capacitor is equal to half the value of the storage capacitor of the main sampler.

9. The blocking sampler as claimed in claim 4, wherein the value of the auxiliary storage capacitor is equal to half the value of the storage capacitor of the main sampler.

* * * * *